United States Patent [19]
Katz et al.

[11] Patent Number: 5,234,149
[45] Date of Patent: Aug. 10, 1993

[54] DEBONDABLE METALLIC BONDING METHOD

[75] Inventors: Avishay Katz, Westfield; Chien-Hsun Lee, North Plainfield; King L. Tai, Berkeley Heights, all of N.J.

[73] Assignee: AT&T Bell Laboratories, Murray Hill, N.J.

[21] Appl. No.: 938,194

[22] Filed: Aug. 28, 1992

[51] Int. Cl.⁵ ............................................. B23K 31/02
[52] U.S. Cl. ............................ 228/123.1; 228/180.22; 228/191; 29/843
[58] Field of Search ............ 228/123, 180.2, 191, 228/264, 103, 104; 29/843, 840

[56] References Cited

U.S. PATENT DOCUMENTS

| | | | |
|---|---|---|---|
| 3,141,226 | 7/1964 | Bender et al. | 228/123 |
| 3,429,040 | 2/1969 | Miller | 29/840 |
| 3,436,818 | 4/1969 | Merrin et al. | 29/840 |
| 3,716,907 | 2/1973 | Anderson | 228/180.2 |
| 4,396,140 | 8/1983 | Jaffe et al. | 228/123 |
| 4,889,275 | 12/1989 | Mullen, III et al. | 228/180.2 |
| 4,940,181 | 7/1990 | Juskey, Jr. et al. | 228/180.2 |
| 5,007,163 | 4/1991 | Pope et al. | 29/840 |
| 5,060,844 | 10/1991 | Behun et al. | 228/180.2 |

Primary Examiner—Mark Rosenbaum
Assistant Examiner—Chuck Y. Mah
Attorney, Agent, or Firm—David I. Caplan

[57] ABSTRACT

One or more metallized chip terminals of an electronic device, such as an integrated circuit chip or a laser chip, in one embodiment are temporarily bonded to one or more metallized substrate pads of a wiring substrate, as for the purpose of electrically testing the electronic device. The composition of the metallized chip terminals is suitably different from that of the metallized substrate pads. The pads and terminals are aligned and electrically connected together with a solder located between them under pressure and a temperature above the melting point of the solder. The solder is cooled, and electrical tests of the electronic device are performed by means of electrical access from testing circuitry to the chip terminals through the substrate pads. Then the solder is heated again above its melting point while being immersed in a liquid flux, whereby the liquid solder wets the metallized chip terminals but not the metallized substrate pads, and the device is gently mechanically pulled away from the wiring substrate and is cooled thereafter. This substrate can thereafter be reused for testing other electronic devices that have similarly suitably metallized terminals. In another embodiment, testing can be performed or not as may be desired; and, as for the purpose of chip operation as an integrated circuit or laser, the chip can be allowed to remain permanently bonded to the substrate in the form of a heat-sinking or heat-spreading submount, or it can be allowed to remain only temporarily bonded to the submount and subsequently pulled away from the submount for the purpose of reuse of the submount for another chip.

20 Claims, 2 Drawing Sheets

DEBONDABLE METALLIC BONDING METHOD

FIELD OF THE INVENTION

This invention relates to methods of bonding and more particularly to methods of metallic bonding one body to another, either permanently or temporarily as may be desired subsequent to the bonding. Such bonding can be used, for example, for the purpose of nondestructive testing of electronic devices, such as semiconductor integrated circuit devices and laser devices, or for the purpose of temporarily or permanently connecting such devices to a heat-sinking or heat-spreading element ("submount") either for testing such devices with the submount or for operating or storing such devices with the submount, or for both such testing and such operating or storing.

BACKGROUND OF THE INVENTION

A major surface of an electronic circuit device—such as a silicon integrated-circuit chip or wafer, or a laser chip—typically has a two-dimensional array of solder bumps or "balls". Each of these bumps is situated on and contacts a separate metallic I/O (Input/Output) terminal of the chip ("chip terminal"). Quite often it is desired to electrically access each of these devices for testing them prior to their being assembled with a package, in order to avoid the cost of packaging defective devices. Thus, it is also desirable that the testing procedure itself does not destroy the device, i.e., that the testing should be nondestructive.

In one conventional nondestructive testing approach, known as "burn-in testing", the devices are tested under conditions of higher electrical and environmental stress—i.e., higher applied voltages and higher ambient temperatures—than would be encountered during normal subsequent operation in the package. Burn-in testing is carried out typically for a time duration in the range of one to ten hours or more. Also, testing for such time durations of electronic devices prior to assembly into packages is also desirable in some other contexts, i.e., in the absence of temperature or electrical stress (or of both).

U.S. Pat. No. 5,007,163 describes a method of nondestructive burn-in testing in which semiconductor integrated-circuit chips can be tested, one after the other, by means of temporary direct attachment of the terminals of each chip to metallic I/O pads of a testing substrate ("substrate pads"). Testing voltages (including power and ground) are applied to some of the chip terminals ("chip input terminals") via a set of wiring in the substrate connected to a set of the substrate pads ("substrate output pads") while the chip terminals and the substrate pads are pressed together under low pressure and while an electrically conductive liquid eutectic joint is formed at room temperature between each of the chip terminals and each of the respective substrate pads. In response to these applied testing voltages, response voltages are developed at other of the chip pads ("chip output terminals"), and these response voltages are measured via another set of wiring in substrate connected to another set of the substrate pads ("substrate input pads"). The eutectic joint remains liquid throughout the electrical testing. Preferably the eutectic is gallium/indium.

After the testing has been completed, the chip pads and the substrate pads are pulled apart, and eutectic material residue remaining on the chip terminals and/or the testing substrate pads is removed, for such residue would interfere with proper (multiple) contacts of the terminals of the next chip to be tested with the thus residue-coated substrate pads.

A disadvantage of the testing method described in the aforementioned patent is the need for removing any remaining eutectic residue, as well as the undesirably high electrical resistance of the liquid joint during testing.

In addition, with or without burn-in or other testing, it is desirable to have a method of bonding a semiconductor integrated circuit device or alternatively a laser device to a heat-sinking or heat-spreading element (submount) and, if desired, subsequently being able to remove the device from the submount, as for the purpose of reusing the submount for supporting another device, or in the alternative, if desired, to allow the device to remain bonded to the submount, as for the purpose of operating the device with the submount but without the need for further processing of the bonding. That is to say, it is desirable to have a method of bonding that can be subsequently temporary or permanent, as is subsequently desired.

SUMMARY OF THE INVENTION

The inventive method involves nondestructively bonding, temporarily or permanently, each of a first set of one or more localized metallized regions (e.g., 16 and 17, respectively) located on a set of wiring terminals (e.g., 8 and 9, respectively) of a first device (e.g., 100), each of the localized regions having a first device metallization (e.g., 12, 13, 14, 15), to a separate one of each of a second set of one or more localized metallized regions (e.g., 31 and 32, respectively) located on a set of pads (e.g., 21 and 22, respectively) of a second device (e.g., 200), each of the localized regions of the second set having a second device metallization (e.g., 23, 24, 25) that is suitably different from the first device metallization. That is to say, the first device metallization has a composition that is suitably chemically different from that of the second device metallization. In one embodiment, the inventive method comprises the steps of:

(a) forming a separate solder ball (e.g., 18, 19) on each of the metallized regions of the first set;

(b) bringing each such solder ball into contiguity with an exposed surface of a separate one of the metallized regions of the second set;

(c) heating each such solder ball to a first temperature that is higher than its melting point, whereby each solder ball becomes a flattened solder ball; and (d) cooling each flattened solder ball to a second temperature that is below its melting temperature, the first and second metallizations having differing first and second compositions, respectively, such that when each cooled flattened solder ball subsequent to step (d) is heated to a third temperature while immersed in a liquid flux that facilitates wetting the first but not the second metallization, the third temperature being higher than the melting point of the solder, each of the flattened solder balls becomes a melted solder ball that wets each of the metallized regions of the first set but does not wet any of the metallized regions of the second set, whereby the first device—if desired for any reason—can be mechanically pulled away from the second device while the melted solder balls are thus immersed in the liquid flux.

In a second embodiment, the method comprises the steps of:

(a) forming a separate solder ball (e.g., 18, 19) on each of the metallized regions of the first set;

(b) bringing each such solder ball into contiguity with an exposed surface of a separate one of the metallized regions of the second set;

(c) heating each such solder ball to a first temperature that is higher than its melting point, whereby each solder ball becomes a flattened solder ball;

(d) immersing each flattened solder ball in a liquid flux that facilitates wetting the first but not the second metallization by the solder;

(e) heating each solder ball to a second temperature that is higher than the melting point of the solder, whereby the solder becomes melted solder, the first and second metallizations having different first and second compositions, respectively, such that in the presence of the liquid flux the melted solder wets each of the metallized regions of the first set but does not wet the metallized regions of the second set; and (f) mechanically pulling apart the first device from the second device while the solder balls are thus melted and thus immersed in the liquid flux.

In neither embodiment does any solder remain on the surface of the second metallization after the first device is mechanically pulled away (debonded) from the second device.

In the second embodiment, it is advantageous, for the purpose of electrically testing the first device, that the method further comprise, between the steps (a) and (b), the step of heating the solder balls to a temperature that is sufficient to soften them but not to melt them. It is further advantageous, for the purpose of electrically testing the first device, that the method further comprises, during the step (c) or between the steps (b) and (c), the step of immersing each solder ball in a reducing gas ambient. It is further advantageous that the method further includes, between the steps (c) and (d), the step of cooling each flattened solder ball to a third temperature that is lower than the melting temperature of the solder. It is further advantageous that the third temperature is at least approximately room temperature.

In the second embodiment, it is yet further advantageous, for the purpose of electrically testing the first device, that the method further includes, after the step of cooling to the third temperature, the step of applying test voltages to the first device through at least one of the metallized regions of the second and first sets, respectively, and the step of measuring a response through at least one other of a metallized region of the first and second sets, respectively.

In the second embodiment, it is yet further advantageous that the method include such testing—or more generally temporarily bonding—of a plurality of first devices, one after the other, using the same second device for all of them.

It is yet further advantageous that the first device metallization is formed by the steps comprising codepositing chromium and copper overlying the terminals, whereby a codeposited chrome-copper layer is formed;

depositing thereon a copper layer; and depositing thereon a gold or a tin layer, and in which the second device metallization is formed prior to step (b) by the steps comprising depositing overlying the input and output pads a layer of tungsten or tantalum or molybdenum or titanium.

It is yet further advantageous that the second device metallization is formed by the steps comprising forming, overlying each of the pads of the second device, a barrier layer that does not contain copper.

It is yet further advantageous that the barrier layer overlying each of the pads of the second device metallization does not contain chromium. And it is yet further advantageous that this barrier layer contains tungsten, tantalum, molybdenum, or titanium.

BRIEF DESCRIPTION OF THE DRAWING(S)

Only for the sake of clarity none of the drawings is to any scale.

DETAILED DESCRIPTION

Figure 1:
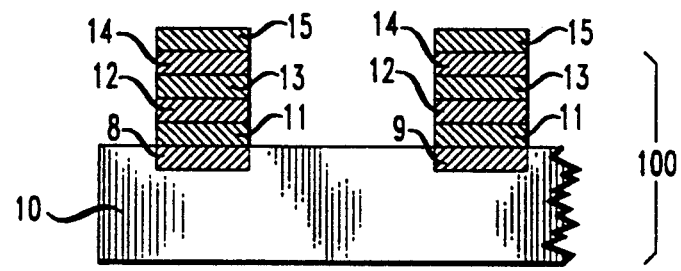
FIG. 1 is an elevational side-view, partly in cross section, of an electronic device to be tested in accordance with a specific embodiment of the invention.
Figure 2:
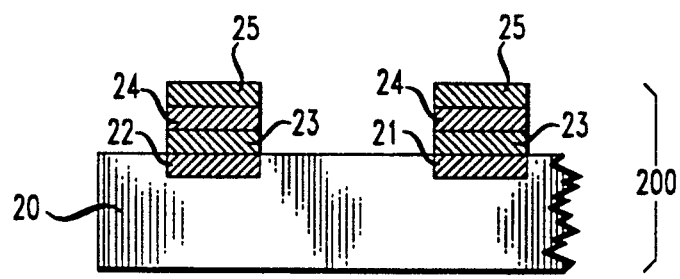
FIG. 2 is an elevational side-view, partly in cross section, of a testing device useful for testing electronic devices in accordance with a specific embodiment of the invention.

An electronic circuit device 100 (FIG. 1) is to be tested with the aid of a testing device (or testing substrate) 200 (FIG. 2). The electronic device 100 is formed by a silicon integrated-circuit chip 10 that has a pair of localized input and output chip wiring terminals 8 and 9, respectively, both typically essentially aluminum. Each of these wiring terminals 8 and 9 is metallized with similar, if not identical, chip terminal metallizations 16 and 17 (FIG. 3), respectively, formed by successive metallization layers, terminated by lead-tin solder layer 15, as known in the art. For example, localized adhesive layers 11, typically essentially titanium or chromium, intervene between each of the wiring terminals 8 and 9 and each of codeposited localized essentially chromium-copper layers 12, the chromium component being non-wettable. Localized wettable layers 13, typically essentially copper, intervene between each of the codeposited layers 12 and each of the localized capping layers 14, typically essentially gold or tin (since tin forms a sufficiently good protective capping metal for copper, at least in conjunction with a lead-tin solder). Finally, evaporated localized lead-tin solder layers 15 are located on each of the capping layers 14. Typically the lead-tin solder has a composition of approximately 95 percent Pb-5 percent Sn by weight. The metallization layers 11, 12, 13, and 14 form input and output chip terminal metallized regions 16 and 17 (FIG. 3), respectively, and these layers can be formed by means of successive standard sputtering to thicknesses that are known in the art.

The testing device 200 (FIG. 2) has a pair of localized metallized output and input substrate wiring pads 21 and 22, respectively, located on a top surface of a ceramic substrate 20. Each of the wiring pads 21 and 22 is typically made of aluminum or copper (if copper, then an adhesive layer, such as sputter-deposited titanium or chromium, intervenes between the substrate 20 and each of the wiring pads 21 and 22). Moreover, each of the wiring pads 21 and 22 is connected through wiring layers (not shown) located on the substrate 20 that extend, respectively, to metallic contacts for enabling attachment of external circuitry thereto (not shown), and thus for enabling electrical access from the external circuitry to the wiring pads 21 and 22.

Each of the substrate wiring pads 21 and 22 is metallized by a separate metallic barrier layer 23—such as sputter-deposited tungsten, tantalum, molybdenum, or titanium. And (if titanium is not used for the barrier layers 23), on each of the barrier layers 23 there is located a separate metallic adhesive layer 24, such as sputtered titanium. Finally, capping layers 25, typically gold or tin, protect the metallizations of the wiring pads 21 and 22. The barrier layers 23, the adhesive layers 24, and the capping layer 25 form output and input substrate wiring pad metallized regions 31 and 32 (FIG. 4) for the output and input wiring pads 22 and 23, respectively.

Figure 3:
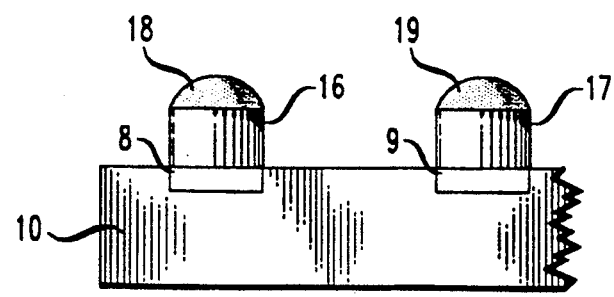
FIGS. 3–6 are elevational side views of various successive stages of testing the device shown in FIG. 1 in accordance with the specific embodiment of the invention.

In order to perform a desired burn-in testing of the electronic circuit device 100 (or in order to electrically access the device 100 for any other desired purpose), this device 100 is placed in a chamber (not shown) and is advantageously kept clean by means of a reducing gas ambient under a pressure of approximately 15 Pascal. This ambient can be, for example, formic acid vapor, carbon monoxide, or forming gas (in decreasing order of preference). The chamber is heated to a temperature $T=T_1$ that is sufficient to melt the lead-tin solder layers 15, whereby they form solder balls 18 and 19 (FIG. 3). Typically, this temperature $T_1$ is equal to approximately 342° C., the melting point of the Pb-Sn solder being approximately 318° C. The testing substrate 200 is also placed in the chamber. The temperature of the chamber is then reduced to $T=T_2$, where $T_2$ is typically equal to approximately 250° C., still with the reducing gas ambient under pressure, in order to solidify the solder balls 18 and 19, and at the same time to keep them softened.

Figure 4:
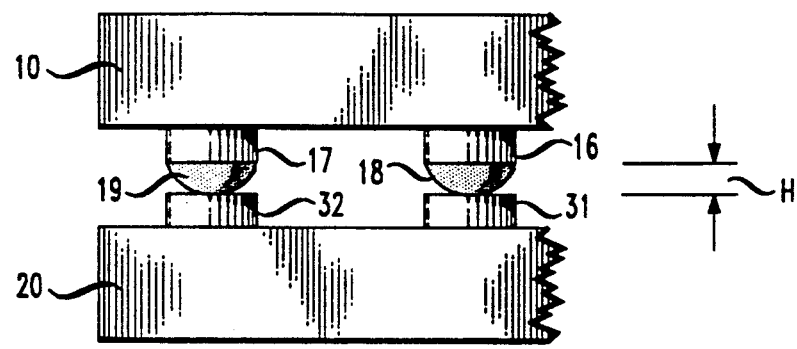
Figure 5:
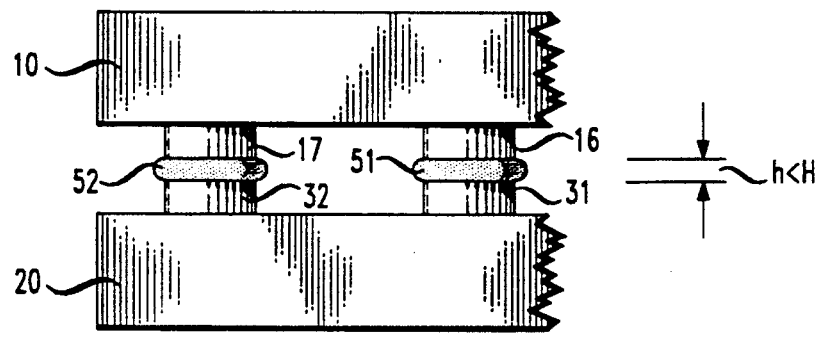

In the chamber, the circuit device 100 is upside-down (FIG. 3)—i.e., is "flipped"—and its solder balls 18 and 19 are aligned and brought into direct physical contact with the substrate pad metallized regions 31 and 32, respectively (FIG. 4). The temperature T is then raised to a value higher than the melting temperature of the solder balls, typically to approximately 340° C. or more, whereby the solder balls 18 and 19 (FIG. 4) become melted and thus become compressed, typically merely by the weight of the electronic device 10, into flattened solder balls 51 and 52, respectively (FIG. 5). Thus the (vertical) thickness of the solder is reduced from H to h, while the flattened solder balls 51 and 52 wet the surface of the substrate pad metallized regions 31 and 32. In this way, relatively large-area electrical contacts are obtained not only between each of the flattened solder balls 51 and 52, respectively, and each of the chip terminal metallized regions 16 and 17 but also between each of the flattened solder balls 51 and 52, respectively, and each of the substrate pad metallized regions 31 and 32. Thus, desirably relatively low electrical resistance is obtained from each of the chip terminals 8 and 9, respectively, to each of the substrate wiring pads 21 and 22.

The temperature in the chamber is then reduced, typically to room temperature. The desired electrical access to the chip 10 for testing (or other purpose) is achieved by external electrical testing (or other) circuitry (not shown) electrically connected (to and) through the output and input wiring pads 21 and 22, through the substrate pad metallized regions 31 and 32, respectively, and thus through the flattened solder balls 51 and 52, respectively, through the chip terminal metallized regions 16 and 17, respectively, through the chip input and output wiring terminals 8 and 9, respectively, and hence to the circuitry (not shown) of the integrated circuit chip 10.

Figure 6:
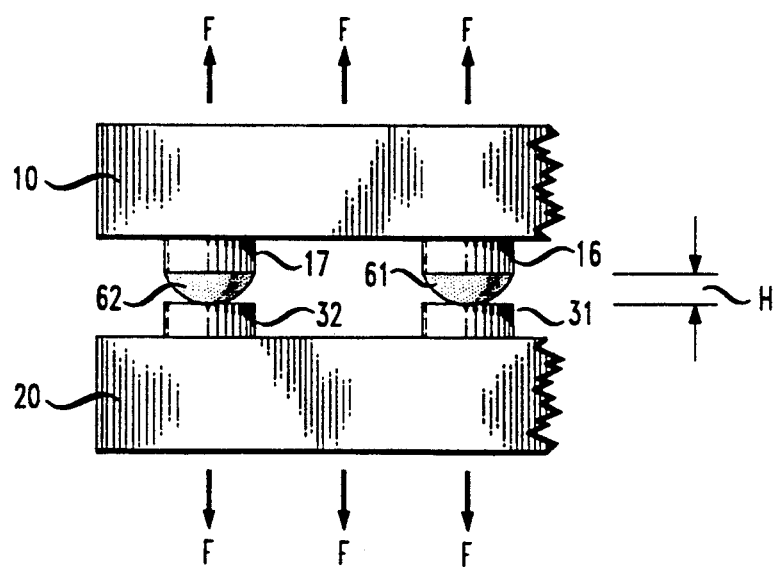

After the desired electrical testing has been completed, the reducing gas ambient is removed from the chamber and the flattened solder balls 51 and 52 are immersed in a liquid flux such as a mixture of polyethylene glycol and rosin. The polyethylene glycol preferably has a molecular weight of 400 or 600. Tensile forces F (FIG. 6) are applied to the chip 10 and to the substrate 20 sufficiently to gently pull them apart while the flattened solder balls 51 and 52 are heated to a temperature that is higher than the melting temperature of the solder, that is, to a temperature of typically approximately 340° C. As a consequence, melted solder balls 61 and 62 form in a less flattened shape, as indicated in FIG. 6, because the melted solder does not wet—i.e., dewets—the surfaces of the substrate pad metallized regions 31 and 32, while the melted solder does wet the surfaces of the chip terminal metallized regions 16 and 17. Thus, as shown in FIG. 6, while the flattened solder balls 51 and 52 are contiguous with substantially the entire bottom surfaces of the chip terminal metallized regions 31 and 32, respectively, and with substantially the entire bottom surfaces of the substrate pad metallized regions 16 and 17, respectively; and while the melted solder balls 61 and 62 are contiguous with substantially the entire bottom surfaces of the chip terminal metallized regions 16 and 17, respectively—the melted solder balls 61 and 62 are not contiguous with the entire top surfaces of the substrate pad metallized regions 31 and 32. In this way, after the electronic device 100 has been completely pulled away (not shown) from the testing device 200, there will be no undesirable amount of residue of the solder that remains on any of the substrate wiring pad metallized regions 31 and 32. Thereafter, testing of other chips (not shown), one after the other, can be performed, using the same steps as above and the same testing device 200.

Although the invention has been described in detail in terms of a specific embodiment, various modifications can be made without departing from the scope of the invention.

For example, other metallizations of the substrate wiring pads 21 and 22, as well as of the chips wiring terminals 8 and 9, can be used in combination with other high-boiling-point (above approximately 220° C.) liquid fluxes, such as a "Fluoroinert" mixed with rosin.

Moreover, the device 100 can be a laser device to be tested; that is to say, the chip 10 can be a laser chip to be tested while it is mounted on a diamond or other submount in accordance with the above-described metallizations. Each such laser device which fails the test is then removed from the submount by the above-described nondestructive mechanical pulling in the presence of the heated liquid flux and is discarded, whereas the submount is thus recovered and can be reused for supporting another laser device. Alternatively, the device is never removed from the submount but is allowed to remain bonded to it and operated with it intact. As a further alternative, subsequent to the bonding the laser device is stored or operated with the submount and at any time thereafter the device, whether or not operative, is removed from the submount (while immersed in the heated liquid flux), and the submount is thus recovered for use as a submount for another device—for example, in case the design of the device becomes outmoded or the device becomes surplus. Also, testing need not be performed with any particular mounted device: the testig can be performed with a sampling of one or more of a group of devices, or with none of them, or with all of them, as desired.

In the case of the laser device, there can be as few as a single output substrate pad 21 and no substrate input pad at all, and at the same time as few as but a single input chip wiring terminal 8 and no output chip wiring terminal at all. The metallization of the substrate pad can be the same as described above in detail for testing the silicon integrated circuit chip 10. The laser device is tyically a gallium arsenide or indium phosphide based device, and the laser chip's wiring terminal is typically a germanium ohmic contact that is metallized, for example, by the following successive metallic layers: a chromium or titanium adhesive layer, a tungsten barrier layer, a codeposited layer of tungsten with nickel tin, a nickel tin wetting layer, a composite gold-tin layer formed by alternating layers of gold and tin—advantageously at least three gold and two tin layers. This composite gold-tin layer, together with the gold capping layer 25 located on the substrate wiring pad metallization, advantageously has an overall eutectic composition.

Instead of the foregoing metallization, the laser chip wiring terminal can be metallized by successive layers of the following: titanium, platinum, gold, and gold-tin solder, or of the following: titanium, nickel, and multiple alternating layers of gold and tin as described above; and at the same time the barrier layer of substrate pad metallization can be either tungsten, molybdenum, or tantalum.

It should also be understood that other metallizations can be used for metallizing either the silicon integrated circuit chip terminals or the laser chip terminal(s), as well as the substrate pads, so long as the above-described required wetting-dewetting asymmetry between the respective metallizations results when they are melted in the liquid flux and the tensile forces F are applied. Also, instead of lead-tin solder, other solders can be used such as gold-tin, gold-germanium, or gold-silicon.

It should be further understood that the temporary bonding of this invention can be used for purposes other than electrical testing, such as bonding, followed by debonding if desired, of battery contacts.

We claim:

1. A method of bonding each of a first set of one or more localized metallized regions on a set of wiring terminals of a first device, each of the localized regions having a first device metallization, to a separate one of each of a second set of one or more metallized regions located on a set of pads of a second device, each of the localized regions of the second set having a second metallization that is different from the first metallization, comprising the steps of:
    (a) forming a separate solder ball on each of the metallized regions of the first set;
    (b) bringing each such solder ball into contiguity with an exposed surface of a separate one of the metallized regions of the second set;
    (c) heating each such solder ball to a first temperature that is higher than its melting point, whereby each solder ball becomes a flattened solder ball; and
    (d) cooling each flattened solder ball to a second temperature that is below its melting temperature, the first and second metallizations having differing first and second compositions, respectively, such that when each flattened solder ball is heated to a third temperature while immersed in a liquid flux that facilitates wetting the first but not the second metallization, the third temperature being higher than the melting point of the solder, each of the flattened solder balls becomes a melted solder ball that wets each of the metallized regions of the first set but does not wet any of the metallized regions of the second set, whereby the first device can be mechanically pulled away from the second device while the melted solder balls are thus immersed in the liquid flux.

2. The method of claim 1 in which the first device metallization is formed prior to step (a) by the steps comprising
    co-depositing chromium and copper overlying the terminals, whereby a co-deposited chrome-copper layer is formed;
    depositing thereon a copper layer; and
    depositing thereon a gold or a tin layer,
    and in which the second device metallization is formed prior to step (b) by the steps comprising
    depositing overlying the pads a layer of tungsten or tantalum or molybdenum or titanium.

3. The method of claim 2 in which the second device metallization is formed, prior to the step (b) by the steps comprising
    forming, overlying each of the pads, a metallic barrier layer that does not contain copper.

4. The method of claim 1 further comprising, prior to step (b), a step of preparing the second device.

5. The method of claim 1 further comprising, prior to step (a), a step of preparing the first device.

6. A method of temporarily bonding each of a first set of one or more localized metallized regions on a set of wiring terminals of a first device, each of the localized regions having a first device metallization, to a separate one of each of a second set of one or more metallized regions located on a set of pads of a second device, each of the localized regions of the second set having a second metallization that is different from the first metallization, comprising the steps of:
    (a) forming a separate solder ball on each of the metallized regions of the first set;
    (b) bringing each such solder ball into contiguity with an exposed surface of a separate one of the metallized regions of the second set;
    (c) heating each such solder ball to a first temperature that is higher than its melting point, whereby each solder ball becomes a flattened solder ball;
    (d) immersing each flattened solder ball in a liquid flux that facilitates wetting the first but not the second device metallization by the solder;
    (e) heating each such solder ball to a second temperature that is higher than the melting point of the solder, whereby the solder becomes melted solder, the first and second metallizations having different first and second compositions, respectively, such that solder in the presence of the liquid flux at the second temperature wets each of the metallized regions of the first set but does not wet the metallized regions of the second set; and (f) mechanically pulling apart the first device from the second device while the solder balls are thus melted and thus immersed in the liquid flux.

7. The method of claim 6 further comprising, prior to step (a), the steps of forming the first metallization and the second metallization.

8. A method according to claim 7 of temporarily bonding, to each of the second set of localized regions of the second device, each of the first set of localized regions of each of a plurality of the first devices, one of the first devices after the other.

9. The method of claim 7 in which the first device metallization is formed prior to step (a) by the steps comprising co-depositing chromium and copper overlying the terminals, whereby a co-deposited chrome-copper layer is formed;

depositing thereon a copper layer; and depositing thereon a gold or a tin protective capping layer, and in which the second device metallization is formed prior to step (b) by the steps comprising depositing overlying the pads a layer of tungsten or tantalum or molybdenum or titanium.

10. The method of claim 6 further comprising, prior to step (b), a step of preparing the second device.

11. A method according to claim 10 of temporarily bonding, to each of the second set of localized regions of the second device, each of the first set of localized regions of each of a plurality of the first devices, one of the first devices after the other.

12. The method of claim 6 further comprising, prior to step (a), a step of preparing the first device.

13. The method of claim 6 further comprising, between steps (a) and (b), the step of heating each solder ball to a temperature that is sufficient to soften it, but not to melt it.

14. The method of claim 6 further comprising, during step (c), or between steps (b) and (c), or between steps (b) and (c) and during step (c), the step of immersing each solder ball in a reducing gas ambient.

15. The method of claim 6 further including, between the step (c) and the step (d), the step of cooling each flattened solder ball to a third temperature that is lower than the melting temperature of the solder.

16. The method of claim 15 further comprising, after the step of cooling to a third temperature, the step of applying test voltages to the first device through at least one of the metallized regions of the second and first sets, respectively, and the step of measuring a response through at least one other of a metallized region of the first and second sets, respectively.

17. The method of claim 16 further comprising, prior to step (b), a step of preparing the second device.

18. The method of claim 16 further comprising, prior to step (a), the step of preparing the first device.

19. A method of testing a plurality of the first devices, one after the other, each in accordance with claim 17.

20. A method according to claim 6 of temporarily bonding, to each of the second set of localized regions of the second device, each of the first set of localized regions of each of plurality of the first devices, one of the first devices after the other.

* * * * *